(12) United States Patent  (10) Patent No.: US 8,742,839 B2
Shih et al.  (45) Date of Patent: Jun. 3, 2014

(54) DOUBLE THROUGH SILICON VIA STRUCTURE

(71) Applicant: National Tsing Hua University, Hsinchu (TW)

(72) Inventors: Hsiu-Chuan Shih, Tainan (TW); Cheng-Wen Wu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 11 days.

(21) Appl. No.: 13/714,923

(22) Filed: Dec. 14, 2012

(65) Prior Publication Data

US 2014/0062586 A1   Mar. 6, 2014

(30) Foreign Application Priority Data

Aug. 31, 2012   (TW) .............................. 101131944 A

(51) Int. Cl.
  *H01L 25/00*  (2006.01)
  *H01L 23/50*  (2006.01)
(52) U.S. Cl.
  CPC ...................................... *H01L 23/50* (2013.01)
  USPC ....................................................... 327/564

(58) Field of Classification Search
  USPC .................................................. 327/564–566
  See application file for complete search history.

(56) References Cited

U.S. PATENT DOCUMENTS 7,358,783 B1 *  4/2008  Wang et al. .................... 327/156
  2011/0128072 A1 *  6/2011  Choi et al. ..................... 327/565

* cited by examiner

*Primary Examiner* — Sibin Chen
(74) *Attorney, Agent, or Firm* — Muncy, Geissler, Olds & Lowe, P.C.

(57) ABSTRACT

This invention discloses a double Through Silicon Via (TSV) structure, including a first die unit, a first signal path, a second signal path, a receiving unit and a second die unit. The first and the second signal paths respectively include a driving unit and a TSV unit. Each driving unit includes a first end, a second end and a third end. The invention divides the signal paths of the conventional double TSV into two different signal paths by two driving units and the receiving unit having OR gate or NOR gate, to avoid generating the problem of signal degradation from the TSV unit with short defect. The invention further disposes a first switch unit, a second switch unit, a first exchange unit, a second exchange unit, a first VDD keeper and a second VDD keeper, to avoid generating the problems of open defect and leakage current.

7 Claims, 9 Drawing Sheets

DOUBLE THROUGH SILICON VIA STRUCTURE

CROSS-REFERENCE TO RELATED APPLICATION

This application claims the benefit of Taiwan Patent Application No. 101131944, filed on Aug. 31, 2012, in the Taiwan Intellectual Property Office, the disclosure of which is incorporated herein in its entirety by reference.

BACKGROUND OF THE INVENTION

1. Field of the Invention

The present invention relates to a through silicon via structure, and more particularly to the double through silicon via structure having an improved circuit structure to prevent the defects of short circuit and broken circuit.

2. Description of the Related Art

Through-Silicon Via (TSV) packaging technology is an interconnect technology of the 3D package that follows the Moore's Law, and the TSV stacks a plurality of chips like a sandwich to form an electrically interconnected three-dimensional stack package, wherein the TSV promotes the 2D chip layout technology to the 3D stack technology and already starts its operation in production lines already. The TSV three-dimensional stack technology includes the thinning and boring of wafers, and the filling of via with a conductive material, and the connection of wafers in order to combine the wafers as a whole. The TSV three-dimensional interconnect technology has a shorter interconnect path, a lower resistance, a lower inductance and a more efficient signal and power transmission than those of the wire bonding as well as the advantage of having no particular limitation on the quantity of stacked dies, and thus the TSV technology has been adopted in the areas of CMOS sensor, and memory and will be applied in the areas of baseband, radio frequency and process very soon. The TSV technology can efficiently enhance both integrity and performance for the system with a lower cost.

However, a plurality of conventional TSVs is coupled to each other through the same node and the driving circuit and coupled to the receiving circuit through the same node, so that if one of the TSVs has a defect of short circuit, the other TSVs will be shortly circuited as well. In other words, signals passing through the good TSV may be attenuated or restricted to 0. In addition, the TSV may have a defect of open circuit because of damages of the conductor, a void between the TSV and a bonding pad or a dislocation occurred during the bonding process.

In view of the aforementioned problems, it is a main subject for the present invention to provide a double TSV structure to improve the tolerance of the double through silicon via towards the defects of short circuit and open circuit.

SUMMARY OF THE INVENTION

Based on the aforementioned problems in the prior art technique, one objective of the present invention is to provide a double through silicon via structure to avoid the defects of both short circuit and open circuit generated from the double through silicon via structure.

According to the objective of the present invention, a double through silicon via structure is provided. This double through silicon via structure comprises a first die unit, a first signal path, a second signal path, a receiving unit and a second die unit. The first die unit outputs the inputted signal. The first signal path includes a first driving unit and a first TSV unit. The first driving unit includes a first end, a second end and a third end. The first end of the first driving unit is electrically coupled to the output end of the first die unit and the second end of the first driving unit is electrically coupled to the input end of the first through silicon via unit. The second signal path includes a second driving unit and a second TSV unit. The second driving unit includes a first end, a second end and a third end. The first end of the second driving unit is electrically coupled to the output end of the first die unit and the second end of the second driving unit is electrically coupled to the input end of the second through silicon via unit. The input end of the receiving unit is electrically coupled to the output ends of both the first and the second through silicon via unit. The input end of the second die unit is electrically coupled to the output end of the receiving unit.

Preferably, the first driving unit receives an input signal to output a first signal in an opposite direction of the input signal to the first TSV unit and drives the first TSV unit to transmit a first signal; the second driving unit receives an input signal to output a second signal in an opposite direction of the input signal to the second TSV unit and drives the second TSV unit to transmit the second signal; and the receiving unit receives the first signal and the second signal to output a combined signal to the second die unit.

Preferably, the receiving unit includes an OR gate or a NOR gate to reconstruct the first and second signals into a combined signal.

Preferably, the present invention further comprises an inverter, which has an input end electrically coupled to the output end of the first die unit and an output end electrically coupled to the first signal path and the second signal path. And after the inverter receives the input signal, it outputs the control signal to both the first and the second signal paths.

Preferably, both the first and the second signal paths further comprise a first switch unit and a second switch unit respectively. The first switch unit has an input end electrically coupled to an output end of the inverter, and an output end electrically coupled to the third end of the first driving unit, and the second switch unit has an input end electrically coupled to the output end of the inverter and an output end electrically coupled to the third end of the second driving unit. Wherein the first and the second switch units receive the control signals to respectively turn off each VDD driving path in both the first and the second driving units.

Preferably, the inverter generates a control signal upon a delay time. The delay time is longer than a voltage rising time of the first signal transmitted by the first TSV unit and a voltage rise time of the second signal transmitted by the second TSV unit.

Preferably, the first signal path further comprises a first exchange unit, and the second signal path further comprises a second exchange unit. The first exchange unit has an output end electrically coupled to an input end of the receiving unit and an input end electrically coupled to an output end of the second TSV unit, and the second exchange unit has an output end electrically coupled to an input end of the receiving unit and an input end electrically coupled to the output end of the first TSV unit. Wherein the first exchange unit receives the second signal, and when the second signal is zero, the second signal is transmitted to the receiving unit through the first exchange unit, and the second exchange unit receives the first signal, and when the first signal is zero, the first signal is transmitted to the receiving unit through the second exchange unit.

Preferably, the first signal path further comprises a first voltage keeper and the second signal path further comprises a second voltage keeper. The first voltage keeper has an input end electrically coupled to the first end of the first driving unit, and an output end electrically coupled to the second end of the first driving unit, and the second voltage keeper has an input end electrically coupled to the first end of the second driving unit and an output end electrically coupled to the second end of the second driving unit. The first voltage keeper has a driving capacity greater than the driving capacity of the first exchange unit to stabilize the first TSV unit transmitting the first signal to the receiving unit, and the second voltage keeper has a driving capacity greater than the driving capacity of the second exchange unit to stabilize the second TSV unit transmitting the second signal to the receiving unit.

Preferably, the double through silicon via structure of the present invention further comprises an exchange unit, which has an input end electrically coupled to an output end of both the first and second through silicon via, and an output end electrically coupled to an input end of the receiving unit. Wherein the exchange unit receives a first and a second signal. When the first signal is zero, the first signal is transmitted to the receiving unit through the second signal path which receives the signal first and sends it out later. When the second signal is zero, the second signal is transmitted to the receiving unit through the first signal path which receives the signal first and sends it out later.

Preferably, the first signal path further comprises a first voltage keeper and the second signal path further comprises a second voltage keeper. The first voltage keeper has an input end electrically coupled to the first end of the first driving unit, and an output end electrically coupled to the second end of the first driving unit, and the second voltage keeper has an input end electrically coupled to the first end of the second driving unit and an output end electrically coupled to the second end of the second driving unit. Wherein both the first and the second voltage keepers have a driving capacity greater than the driving capacity of the exchange unit respectively to stabilize the first TSV unit transmitting the first signal to the receiving unit as well as the second TSV unit transmitting the second signal to the receiving unit.

In summation of the description above, the double through silicon via structure of the present invention includes one or more advantages as follows:

(1) The double through silicon via structure can overcome the problems of short circuit such as the leakage current and the signal degradation, etc. through the signal path division and the VDD isolation. When applying this technique for the handheld electronic device or any other apparatus consuming more electricity, the invention could consume extremely less electricity and elongate the use time of the electronic device as well.

(2) With the improvement of structures at circuit level in the double through silicon via structure, no additional test circuits are required to be disposed for defect detection, which efficiently saves the time for testing.

(3) The double through silicon via structure is needless to set up any safety fuse, electrical fuse or anti-fuse there within, thus saving the arrangement of the fuse layer. Therefore, not only the complexity of the double through silicon via structure is decreased, but the cost is also reduced.

(4) The double through silicon via structure could avoid the problem of open circuit from generating by the arrangement of the first exchange unit, the second exchange unit, the first voltage keeper and the second voltage keeper.

DETAILED DESCRIPTION OF THE PREFERRED EMBODIMENTS

The technical contents and characteristics of the present invention will be apparent with the detailed description of a preferred embodiment accompanied with related drawings as follows. For simplicity, the same numerals are used for the same respective elements in the description of the following preferred embodiments and the illustration of the drawings.

Figure 1:
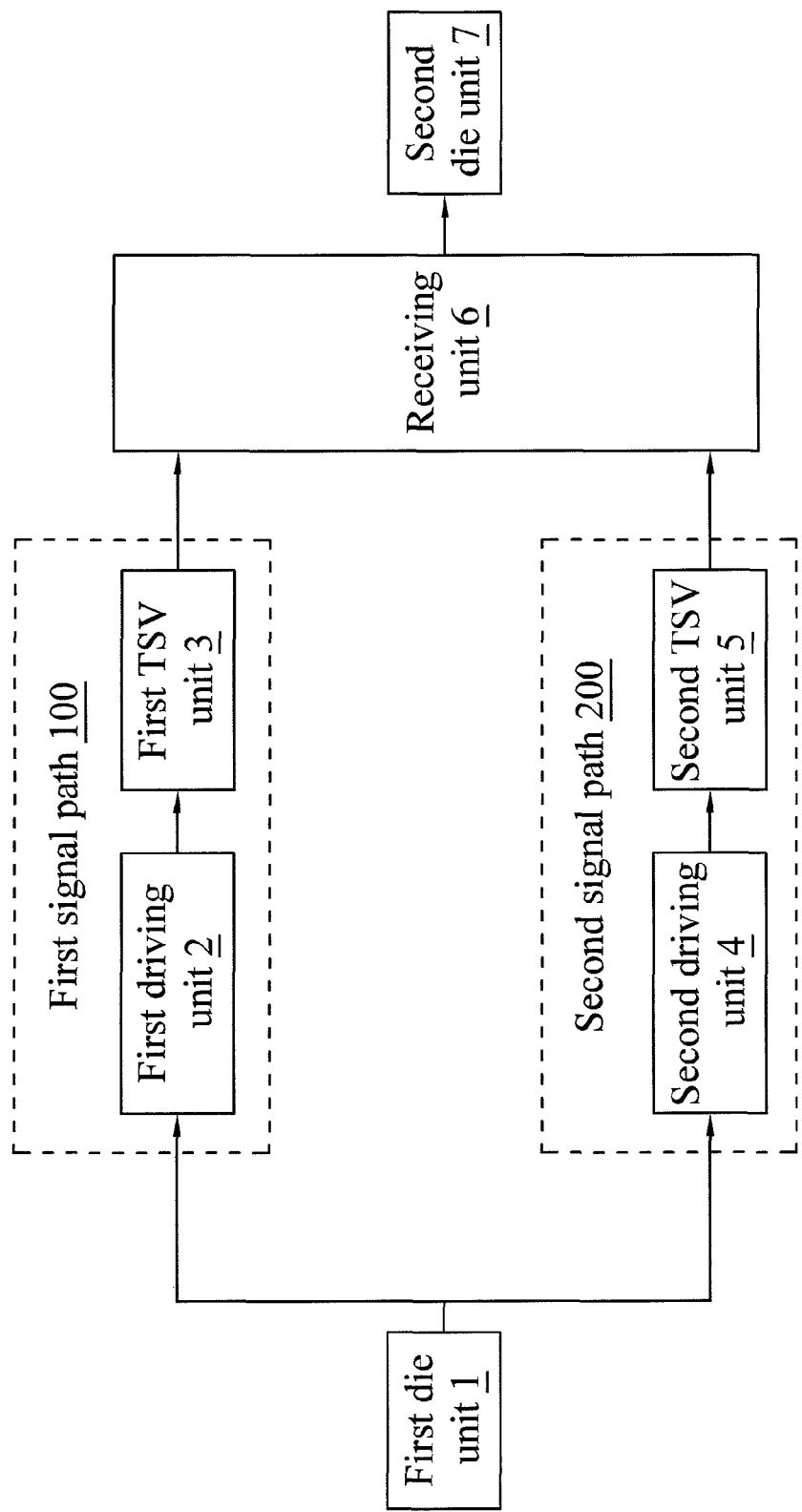
FIG. 1 is a block diagram of a double through silicon via structure of a first preferred embodiment of the present invention.

With reference to FIG. 1 for a block diagram of a double through silicon via structure of the first preferred embodiment of the present invention, the double through silicon via structure comprises a first die unit 1, a first signal path 100, a second signal path 200, a receiving unit 6 and a second die unit 7, wherein the receiving unit 6 includes an OR gate or a NOR gate, but the present invention is not limited to such arrangement only. The first die unit 1 outputs an input signal to the first signal path 100 and the second signal path 200. The first signal path 100 comprises a first driving unit 2 and a first TSV unit 3, and the first driving unit 2 comprises a first end, a second end and a third end, wherein the first driving unit 2 includes but not limited to an inverter. The first driving unit 2 has a first end electrically coupled to an output end of the first die unit 1, and a second end electrically coupled to an input end of the first TSV unit 3. The second signal path 200 comprises a second driving unit 4 and a second TSV unit 5, and the second driving unit 4 comprises a first end, a second end and a third end, wherein the second driving unit 4 includes but not limited to an inverter. The first end of the second driving unit 4 is electrically coupled to the output end of the first die unit 1, and the second end of the second driving unit 4 is electrically coupled to an input end of the second TSV unit 5. An input end of the receiving unit 6 is electrically coupled to output ends of the first TSV unit 3 and the second TSV unit 5; and an input end of the second die unit 7 is electrically coupled to an output end of the receiving unit 6.

Wherein, the first driving unit 2 receives an input signal to output a first signal in an opposite direction of the input signal to the first TSV unit 3 and drives the first TSV unit 3 to transmit a first signal; the second driving unit 4 receives an input signal to output a second signal in an opposite direction of the input signal to the second TSV unit 5 and drives the second TSV unit 5 to transmit the second signal; and the receiving unit 6 receives the first signal and the second signal to output a combined signal to the second die unit 7.

Figure 2:
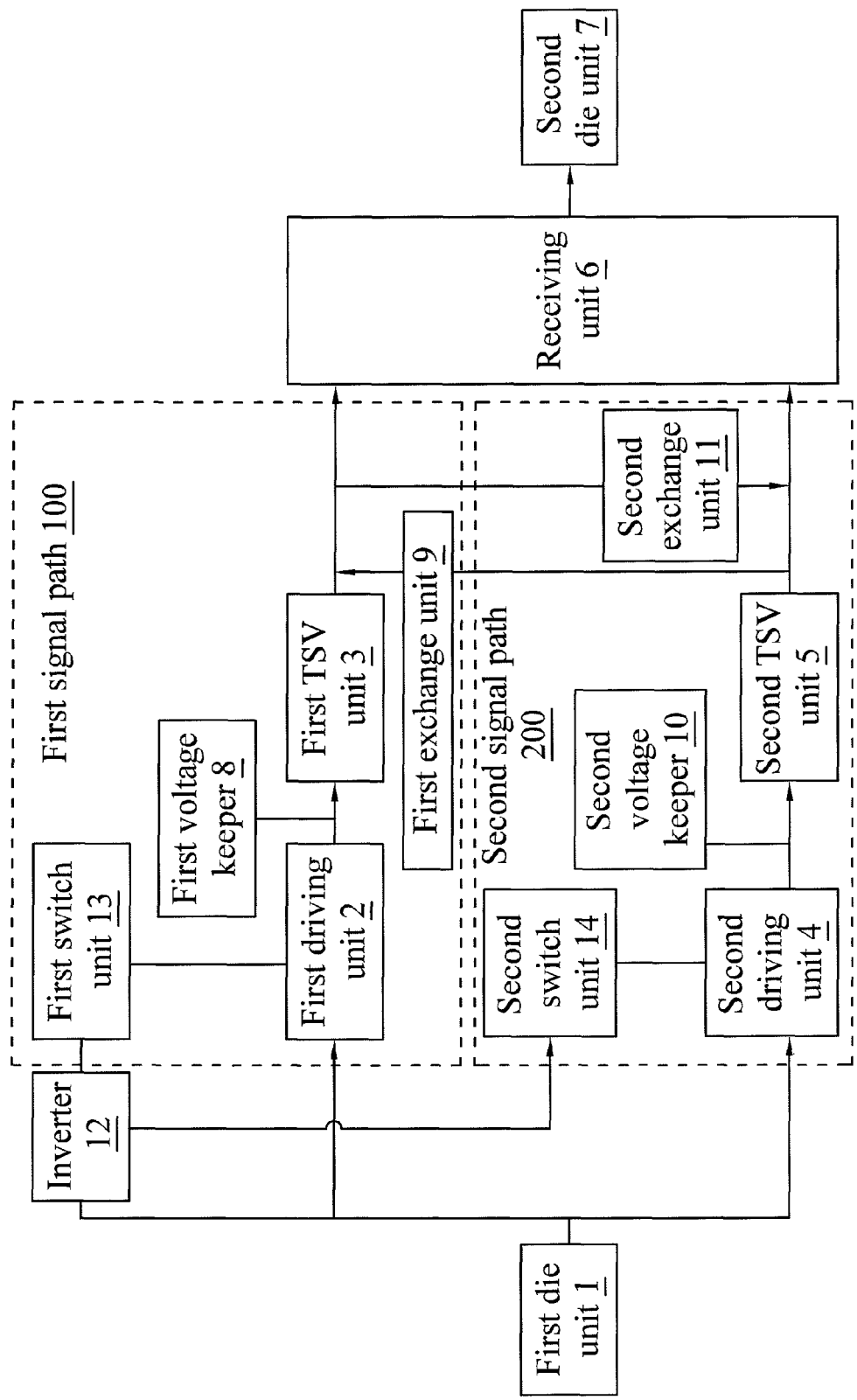
FIG. 2 is a block diagram of a double through silicon via structure of a second preferred embodiment of the present invention.

With reference to FIG. 2 for a block diagram of a double through silicon via structure of the second preferred embodiment of the present invention, the double through silicon via structure comprises a first die unit 1, a first signal path 100, a second signal path 200, a receiving unit 6, a second die unit 7 and an inverter 12, wherein the receiving unit 6 includes an OR gate or a NOR gate, but the present invention is not limited to such arrangements only. The details are identical to those described in FIG. 1 and thus will not be repeated. Wherein, the first signal path 100 further comprises a first switch unit 13, a first voltage keeper 8 and a first exchange unit 9, and the second signal path 200 further comprises a second switch unit 14, a second voltage keeper 10 and a second exchange unit 11. The inverter 12 has an input end electrically coupled to the output end of the first die unit 1 and an output end electrically coupled to the first signal path 100 and the second signal path 200. The first switch unit 13 has an input end electrically coupled to an output end of the inverter 12, and an output end electrically coupled to the third end of the first driving unit 2, and the second switch unit 14 has an input end electrically coupled to the output end of the inverter 12 and an output end electrically coupled to the third end of the second driving unit 4. The first voltage keeper 8 has an input end electrically coupled to the first end of the first driving unit 2, and an output end electrically coupled to the second end of the first driving unit 2, and the second voltage keeper 10 has an input end electrically coupled to the first end of the second driving unit 4 and an output end electrically coupled to the second end of the second driving unit 4. The first exchange unit 9 has an output end electrically coupled to an input end of the receiving unit 6 and an input end electrically coupled to an output end of the second TSV unit 5, and the second exchange unit 11 has an output end electrically coupled to an input end of the receiving unit 6 and an input end electrically coupled to the output end of the first TSV unit 3.

Wherein, the inverter 12 generates a control signal upon a delay time, wherein the delay time is longer than a voltage rising time of the first signal transmitted by the first TSV unit 3 and a voltage rising time of the second signal transmitted by the second TSV unit 5, and the inverter 12 transmits the control signal to the first switch unit 13 of the first signal path 100 and the second switch unit 14 of the second signal path 200 respectively. After both the first switch unit 13 and the second switch unit 14 receive the control signal, the VDD driving path of the first driving unit 2 and the VDD driving path of the second driving unit 4 are respectively closed to avoid the current from leaking. The first exchange unit 9 receives the second signal, and when the second signal is zero, the second signal is transmitted to the receiving unit 6 through the first exchange unit 9, and the second exchange unit 11 receives the first signal, and when the first signal is zero, the first signal is transmitted to the receiving unit 6 through the second exchange unit 11. The first voltage keeper 8 has a driving capacity greater than the driving capacity of the first exchange unit 9 to stabilize the first TSV unit 3 transmitting the first signal to the receiving unit 6, and the second voltage keeper 10 has a driving capacity greater than the driving capacity of the second exchange unit 11 to stabilize the second TSV unit 5 transmitting the second signal to the receiving unit 6.

It is noteworthy that when the first signal path 100 and the second signal path 200 have a floating node to cause a defect of the open circuit, the shielding effect only occurs if the signal outputted from a good TSV unit has a non-dominant value; in other words, the receiving circuit having a NOR gate has a signal value of zero. Therefore, the arrangement of the first exchange unit 9 and the second exchange unit 11 can overcome the problem of open circuit. In the meantime, the signal transmission paths of both the first exchange unit 9 and the second exchange unit 11 may cause the problem of short circuit. Therefore, the present invention further comprises a first voltage keeper 8 and a second voltage keeper 10 installed at the first signal path 100 and the second signal path 200 respectively to stabilize the first and the second TSV units 5 to transmit the signal to the receiving unit 6.

It is noteworthy that the receiving unit 6 of the present invention has an OR gate or a NOR gate, and this logical gate can reconstruct the first signal and the second signal into a combined signal. If there is no defect, and the input signal outputted from the first die unit 1 is x, then the first and second signals outputted by the first driving unit 2 and the second driving unit 4 are ~x. If the signals inputted by the first exchange unit 9 and the second exchange unit 11 are ~x, the signals outputted are also ~x. After the receiving circuit having a NOR gate receives two ~x signals, and a result of x is obtained after the NOR computation is performed. This result is the same as the input signal outputted by the first die unit 1. If one of the signal paths has a defect of the short circuit, the output of the driving circuit of the good signal path is ~x, and the output of the driving circuit with a short circuit occurred at the signal path is 0. After the first exchange unit 9 and the second exchange unit 11 output signals, the first signal and the second signal are either ~x and 0 or 0 and ~x. Finally, the NOR computation of the receiving unit 6 is performed to combine both the first signal and the second signal into ~(~x|0) or ~(0|~x), and this result is x, which is the same as the input signal outputted by the first die unit 1. If one of the signal paths has a defect of the open circuit, the output of the driving circuit of the good signal path is ~x, and the output of the driving circuit with an open circuit occurred at the signal path is Z. After both the first exchange unit 9 and the second exchange unit 11 output signals, the first and the second signals are either ~x and ((~x==0)?0:Z) or ((~x==0)?0:Z) and ~x. Finally, the NOR computation of the receiving unit 6 can combine both the first signal and the second signal into either ~(~x|((~x==0)?0:Z)) or ~(((~x==0)?0:Z)|~x), and this result is the same as the input signal outputted by the first die unit 1. Therefore, the double through silicon via structure of the present invention can enhance the tolerances towards defects for both short circuit and open circuit of the double through silicon via.

In addition, the transmission paths of the first exchange unit 9 and the second exchange unit 11 are grounding voltage driving paths (VSS driving path) corresponding to the VDD driving paths of the driving circuit. Therefore, the present invention can further close the grounding VSS driving paths of the first driving unit 2 and the second driving unit 4 by setting up the first switch unit 13 and the second switch unit 14 respectively, and set the transmission paths of the first exchange unit 9 and the second exchange unit 11 as the VDD driving paths, and the receiving unit 6 having an AND gate or a NAND gate to reconstruct the first signal and the second signal. The double through silicon via structure also can achieve the same effect of the second preferred embodiment of the present invention.

Figure 3:
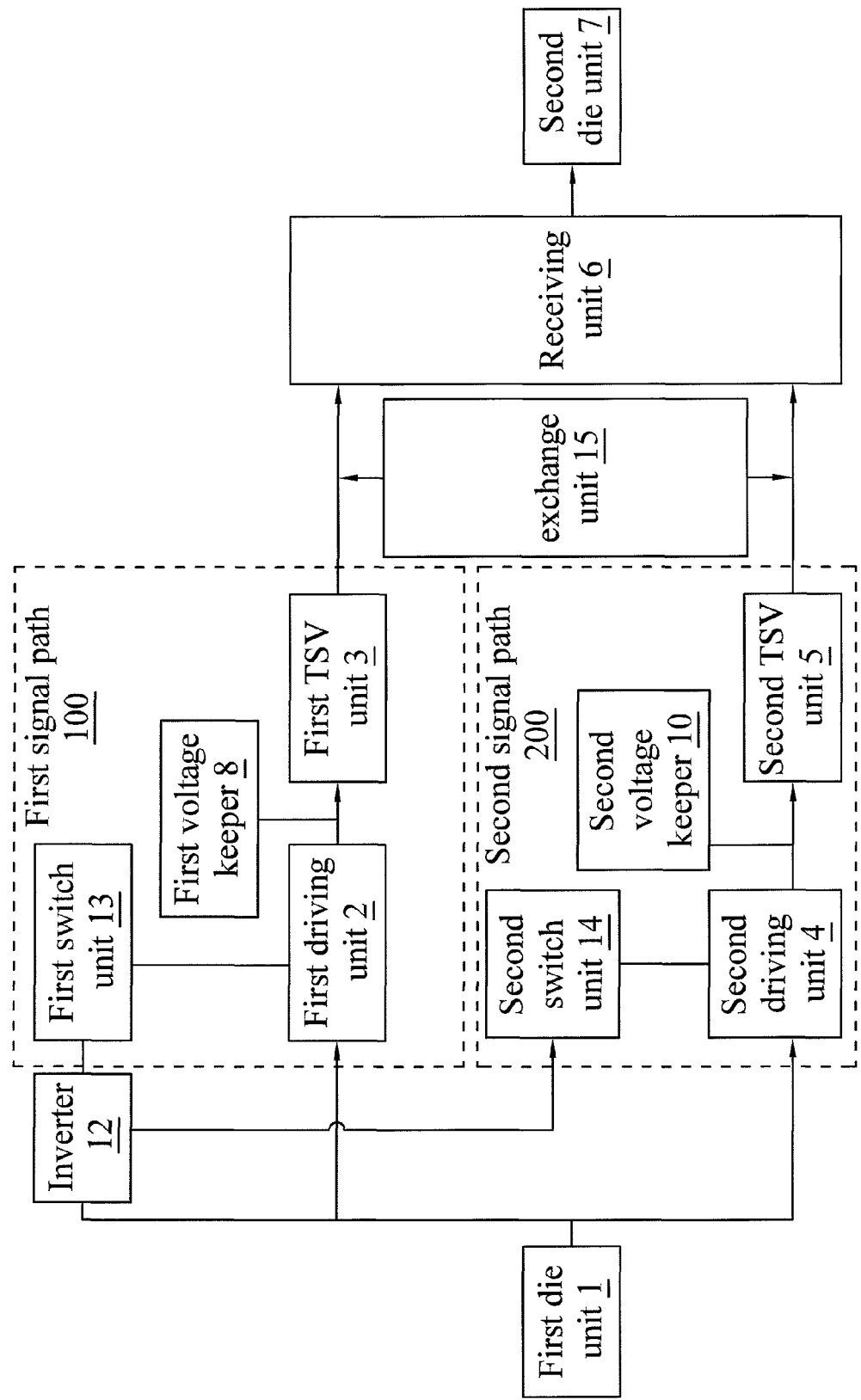
FIG. 3 is a block diagram of a double through silicon via structure of a third preferred embodiment of the present invention.

With reference to FIG. 3 for a block diagram of a double through silicon via structure of the third preferred embodiment of the present invention, the double through silicon via structure comprises a first die unit 1, a first signal path 100, a second signal path 200, a receiving unit 6, a second die unit 7, an inverter 12 and an exchange unit 15, wherein the receiving unit 6 includes an OR gate or a NOR gate, but the present invention is not limited to such arrangement only. Wherein the exchange unit 15 is combined with the first exchange unit 9 and the second exchange unit 11 as shown in FIG. 2. The details are the same as those described in FIG. 2 and thus will not be repeated.

In summation of the description above, the present invention uses the driving unit and the receiving unit 6 to divide the signal path into two signal paths, such that two TSV units can receive the signal of the driving unit without going through the same node, so as to overcome the problem of signal attenuation produced by the conventional double through silicon via. In addition, the present invention comprises the first switch unit 13 and the second switch unit 14 installed at the third ends of the first driving unit 2 and the second driving unit 4 respectively. When the switch unit receives the control signal, the VDD driving path of the driving unit is closed to overcome the problem of current leakage of the conventional double through silicon via. In addition, since the double through silicon via structure may have a defect of the open circuit caused by a floating node problem, the shielding effect only occurred if signals outputted from a good TSV unit are non-dominant; in other words, the signal value of the receiving circuit having a NOR gate equals to zero, the design of the first exchange unit 9 and the second exchange unit 11 can overcome the problem of open circuit. Meanwhile, the signal transmission paths of the first exchange unit 9 and the second exchange unit 11 may also cause the problem of short circuit. Therefore, the present invention further comprises a first VDD keeper 8 and a second VDD keeper 10 installed at the first signal path 100 and the second signal path 200 respectively to stabilize the first and the second TSV units 5 to transmit signals to the receiving unit 6.

The present invention is further described in details as follows:

In a conventional IC design, a double or multiple through via interconnection between different metal layers used for detecting tolerance is very common and practical. However, if the interconnecting environment is from the metal layer to the crystal, the material around the through via is changed from an insulator to a conductor, and thus some generated defects may produce a short circuit of TSV toward the ground. In such condition, if one of the double through silicon vias has a short circuit, the other TSV would be affected by the short circuit as well, since the two TSVs use the same node. Therefore, a signal transmitted by a good TSV may be attenuated or restricted to zero. In addition, the short circuit may cause the problem of current leakage. If such product is used in a handheld electronic device, current is very important. Roughly speaking, although the double through silicon via can tolerate an open circuit, yet it comparably cannot resist any defect of short circuit.

Figure 4:
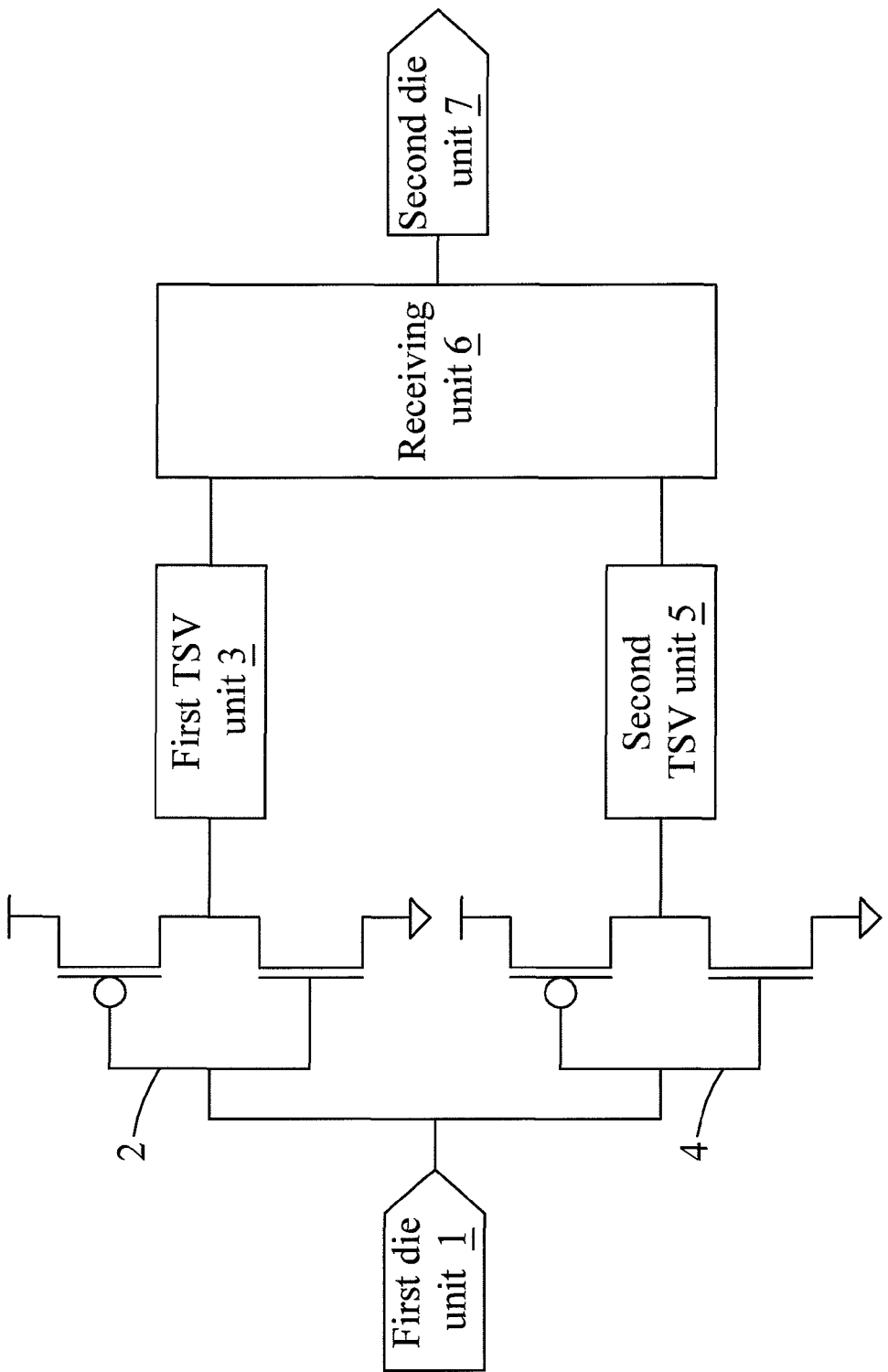
FIG. 4 is a schematic view of a path division of a double through silicon via structure of the present invention.
Figure 5:
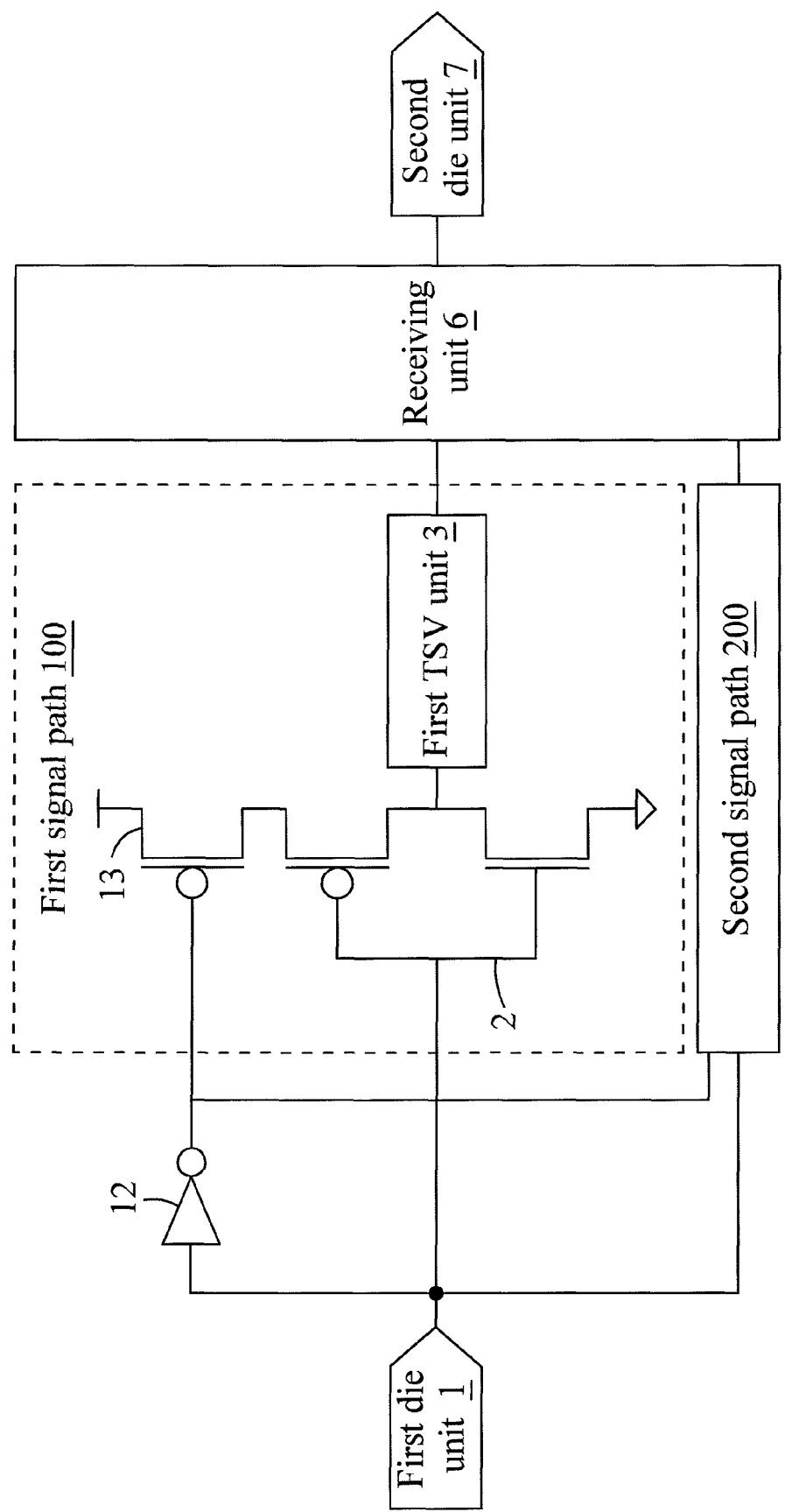
FIG. 5 is a schematic view of a VDD isolation of a double through silicon via structure of the present invention.

To overcome the problem of short circuit in the double through silicon via, the present invention provides an improvement to double through silicon via structure. Firstly, the signal path is divided into two paths in order to avoid signal attenuation caused by a defected TSV in the double through silicon via. The input node of the double through silicon via is separated by two driving circuits, which is accomplished by two inverters in the present invention. The output node of the double through silicon via is separated by the receiving circuit, wherein the receiving circuit has the function of either an OR gate or a NOR gate. Here, assume that the substrate around the TSV is grounded, only the defect restricted to zero may have the short circuit, so that the OR gate or NOR gate can filter and reconstruct the signal. The signal path is divided as shown in FIG. 4. In the structure as shown in FIG. 4, a good TSV is protected by the driving and receiving circuits. Secondly, to prevent any leakage current, the driving element should be turned off at the end of the change of the TSV voltage. Since we assume that the substrate around the TSV is grounded, thus the TSV will never have a short circuit at the VDD. Therefore, we simply require turning off the switch of the driving path used for the VDD driving path in the driving circuit. In this preferred embodiment, the control signal of the switch is an invert signal of the input signal and has a delay time, wherein the delay time is designed to be longer than the rising time of the signal transmission of the TSV. FIG. 5 shows the switch used for separating the driving path. Since the two signal paths are the same, only one of them is shown in the figure. As to the switch, the VDD driving path is always closed at the end of the TSV after the voltage is changed. Therefore, if there is a short circuit, the path of leakage current from the VDD to the substrate is closed, so that the problem of leakage current caused by the short circuit can be overcome.

Although the path division and the VDD isolation can overcome the problem of short circuit, yet another problem of floating node is recreated by the open circuit. If there is an open circuit occurred in one of the double through silicon vias, the output signal reconstructed by the OR/NOR gate may be wrong, and such error may occur at the floating node having the dominant value of the OR/NOR gate. Therefore, the signal may be shielded, if there is an open circuit existed.

Figure 6:
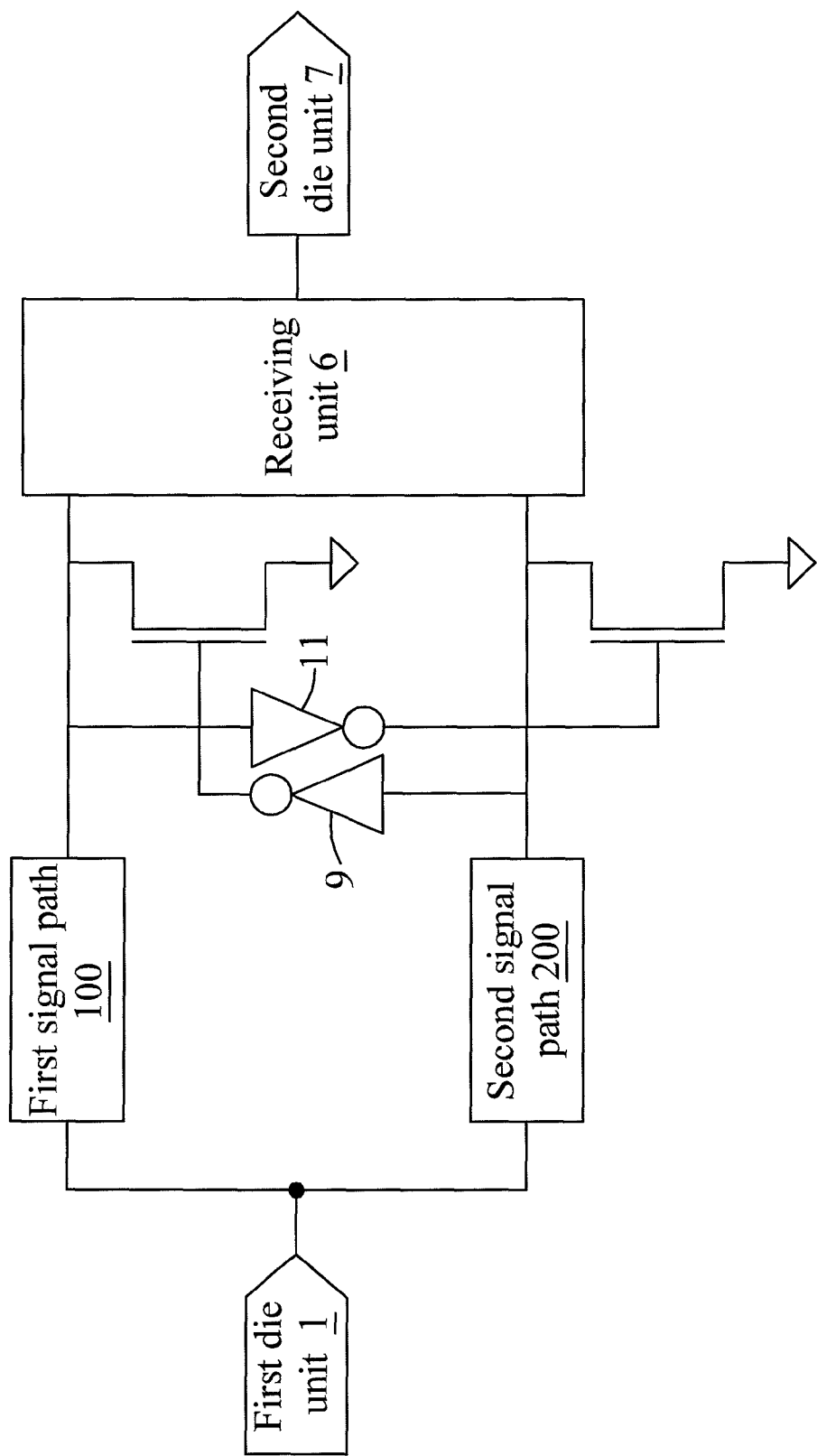
FIG. 6 is a schematic view of a zero driving path of a double through silicon via structure of the present invention.
Figure 7:
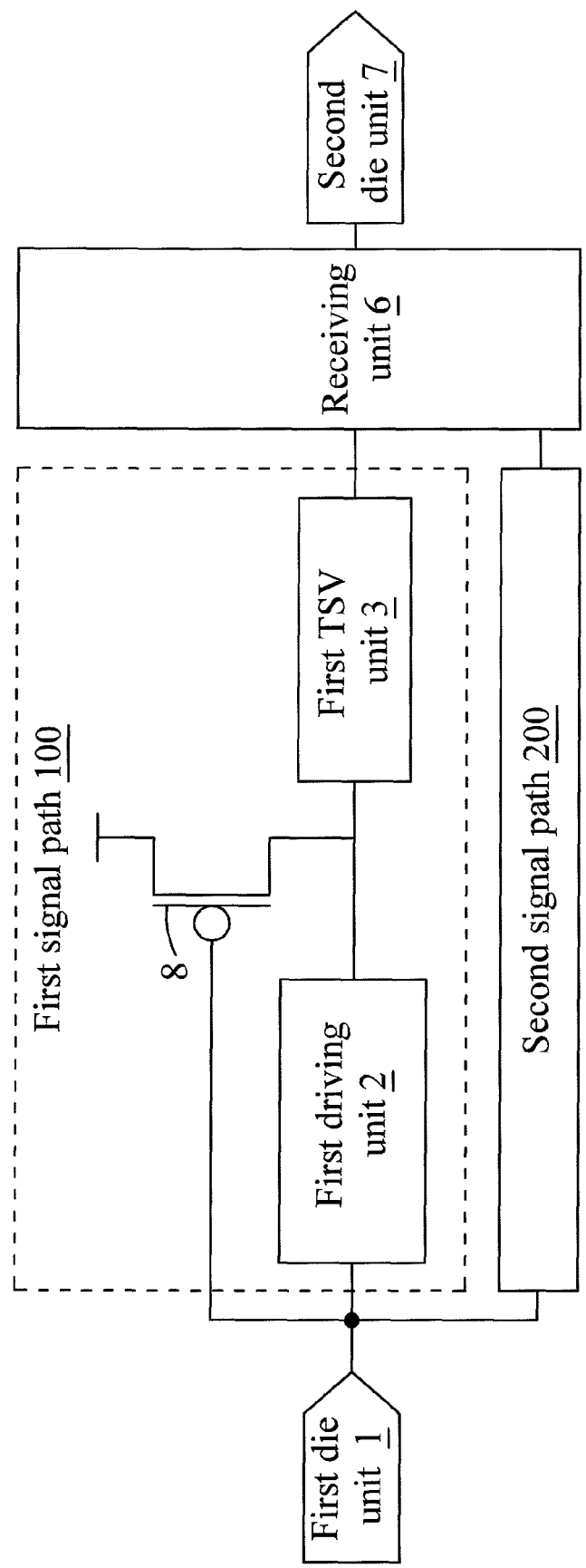
FIG. 7 is a schematic view of a VDD keeper of a double through silicon via structure of the present invention.
Figure 8:
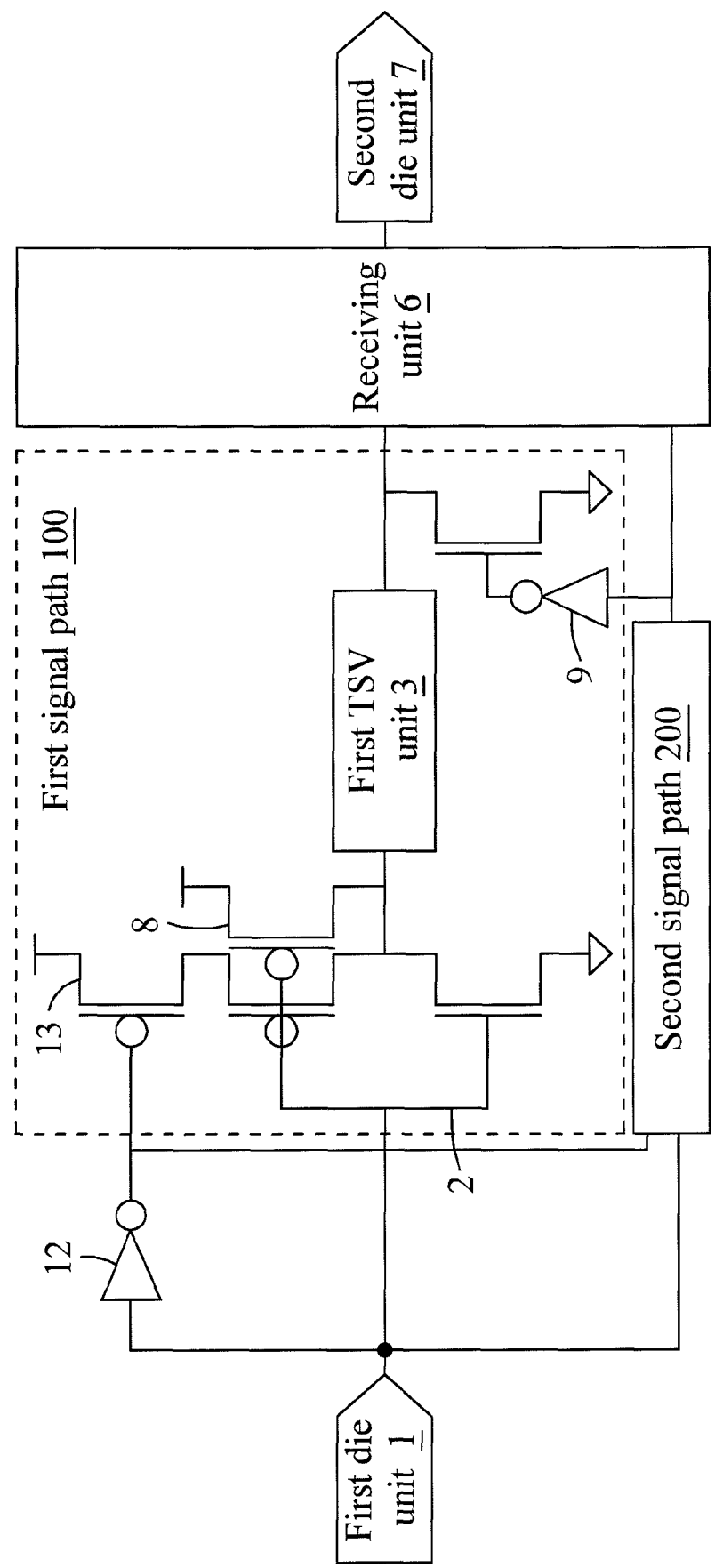
FIG. 8 is a schematic view of a double through silicon via structure of the present invention.

To overcome the aforementioned problem, a signal path between the double through silicon vias is required. Fortunately, the shielding effect only occurs at a signal of the good TSV having a non-dominant value. In other words, the signal is zero to the OR/NOR gate, so that the path in which the signal with a value of zero could pass through is needed as shown in FIG. 6. However, if a short circuit occurs at one of the double through silicon vias, the signal path is also transmitting the influences caused by the short circuit, so that it is necessary to set up a VDD keeper and it should have a greater driving capacity than the path capable of transmitting signals with a value of zero as shown in FIG. 7. The overall improved schematic view is shown in FIG. 8, wherein the signal attenuation can be restricted by the path division, and the leakage current is reduced to the degree for the VDD keeper, wherein the VDD keeper has a current much smaller than the current of the driving element.

In the present invention, the double through silicon via structure may be described with the following model.

Figure 9:
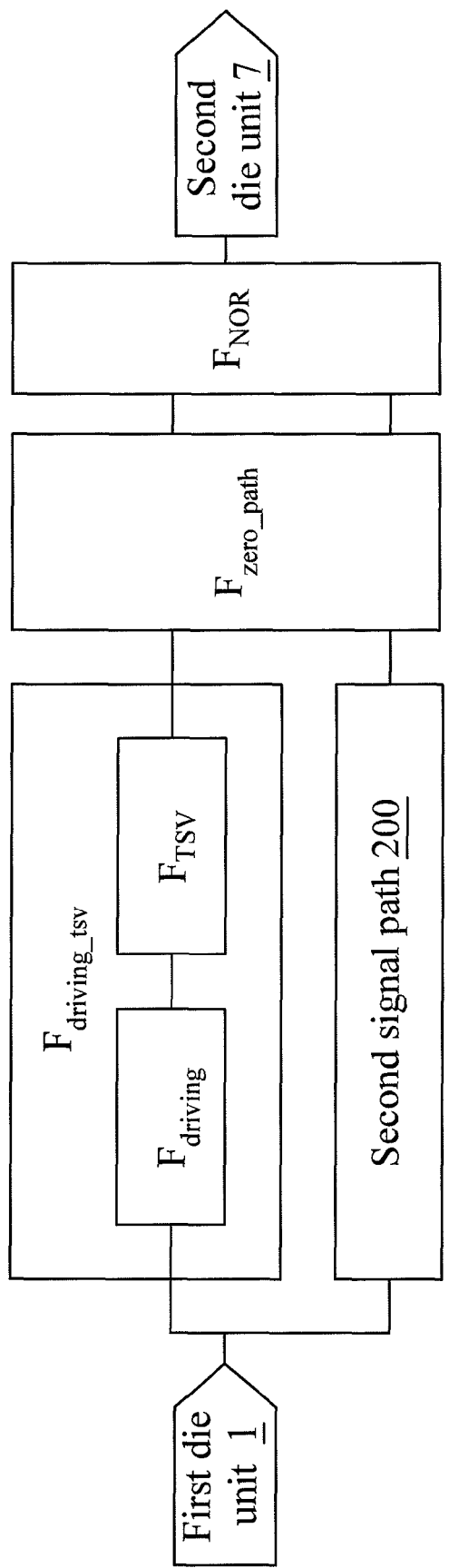
FIG. 9 is a schematic view of a characteristic function of a double through silicon via structure of the present invention.

With reference to FIG. 9 for a block diagram of the overall improved modular structure of the present invention, the function $F_{driving}$ is used in the driving circuit. If there is neither a short circuit nor an open circuit as the defect, the driving circuit is an inverter. Since the driving circuit has an isolation of the VDD path, the output value of the driving circuit is changed to zero, if the TSV with a short circuit is driven. The function $F_{driving}$ is shown below:

$F_{driving}$(input,defect)=(defect==short)?0:~input;

The function FTSV is used in the TSV channel. If there is no defect, the TSV channel can serve as a buffer. On the other hand, if there is a short circuit in the TSV channel, the output value of the TSV channel is zero. To simplify the analysis, we assume the short circuit has a resistance equal to zero. If there is an open circuit occurred in the TSV channel, the output value of the TSV channel equals to the value of the floating node. Here, we assure that the open circuit has an infinite resistance. Therefore, the function FTSV can be represented as follows:

$F_{TSV}$(diel,defect)=(defect==open)?Z:((defect==short)?0: diel);

The following function combines both the driving circuit and the TSV channel:

$F_{driving\_TSV}$(input,defect)=(defect==open)?Z:((defect==short)?0:~input);

The function $F_{zero\_path}$ is used in the zero driving path. In the zero driving path (or zero signal path), a zero signal is transmitted from one double through silicon via to another. In addition, the driving strength of the path is smaller than the driving strength of the VDD kepper. Therefore, if there is a conflict caused by the short circuit of another TSV, the signal value equal to one from the TSV remains unchanged, and the function $F_{zero\_path}$ is represented as follows:

$$F_{zero\_path}(TSV1,TSV2)=[(TSV1==1)?1:((TSV2==0)?0:TSV1),$$

$$(TSV2==1)?1:((TSV1==0)?0:TSV2)];$$

Finally, the function of the receiving circuit is a NOR function as shown below:

$$\text{output}=F_{NOR}(path1,path2)=\sim(path1,path2);$$

The present invention provides evidence for various different situations.

There are three situations, respectively: a situation without any defect; a situation with a short circuit occurred at one of the double through silicon vias, and a situation with an open circuit occurred at one of the double through silicon vias. In a preferred embodiment without any defect, assumed that the input signal is x, the two signal paths have the following results based on the $F_{driving\_TSV}$ function:

$$F_{driving\_TSV}(x,\text{no\_defect})=\sim x;$$

Therefore, the input values of the $F_{zero\_path}$ are ~x, and the output values are also ~x. The result of the $F_{zero\_path}$ function is shown below:

$$F_{zero\_path}(\sim x,\sim x)=[\sim x,\sim x];$$

Therefore, the $F_{NOR}$ behind the $F_{zero\_path}$ can reconstruct the input signals as follows:

$$\text{output}=F_{NOR}(\sim x,\sim x)=\sim(\sim x|\sim x)=x=\text{input};$$

In a preferred embodiment with a short circuit, assumed that the input signal is x, the path without any defect has the following result based on the $F_{driving\_TSV}$ function:

$$F_{driving\_TSV}(x,\text{no\_defect})=\sim x;$$

The path with a short circuit has the following result:

$$F_{driving\_TSV}(x,\text{short})=0;$$

Therefore, the inputs of the $F_{zero\_path}$ are ~x and 0, and the outputs are ~x and 0 as follows:

$$F_{zero\_path}(\sim x,0)=[\sim x,0];$$

Therefore, the $F_{NOR}$ behind the $F_{zero\_path}$ can reconstruct the input signals as follows:

$$\text{output}=F_{NOR}(\sim x,0)=\sim(\sim x|0)=x=\text{input};$$

In a preferred embodiment with an open circuit, assumed that the input signal is x, the path without any defect has the following result based on the $F_{driving\_TSV}$ function:

$$F_{driving\_TSV}(x,\text{no\_defect})=\sim x;$$

The path with an open circuit has the following result:

$$F_{driving\_TSV}(x,\text{open})=Z;$$

Therefore, the inputs of the $F_{zero\_path}$ are ~x and Z, and the outputs are ~x and $((\sim x==0)?0:Z)$ as follows:

$$F_{zero\_path}(\sim x,Z)=[\sim x,(\sim x==0)?0:Z];$$

Therefore, $F_{NOR}$ behind the $F_{zero\_path}$ can reconstruct the input signals as follows:

$$\text{output}=F_{NOR}(\sim x,(\sim x==0)?0:Z)=\sim(\sim x|(\sim x==0)?0:Z=\text{input}$$

Based on the aforementioned three preferred embodiments, the improved function of double through silicon via structure of the present invention is theoretically operable and capable of tolerating a short circuit or an open circuit.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A double through silicon via structure, comprising;
a first die unit, arranged for outputting an input signal;
a first signal path, including a first driving unit and a first TSV unit, and the first driving unit including a first end, a second end and a third end, and the first end of the first driving unit being electrically coupled to an output end of the first die unit, and the second end of the first driving unit being electrically coupled to an input end of the first TSV unit;
a second signal path, including a second driving unit and a second TSV unit, and the second driving unit including a first end, a second end and a third end, and the first end of the second driving unit being electrically coupled to the output end of the first die unit, and the second end of the second driving unit being electrically coupled to the input end of the second TSV unit;
a receiving unit, with an input end electrically coupled to output ends of the first TSV unit and the second TSV unit; and
a second die unit, with an input end electrically coupled to an output end of the receiving unit; and
an inverter, with an input end electrically coupled to an output end of the first die unit and output ends of the inverter are electrically coupled to both the first signal path and the second signal path, and the inverter receiving the input signal to output a control signal to the first signal path and the second signal path;
wherein the first driving unit receives the input signal for outputting a first signal in an opposite direction of the input signal to the first TSV unit and drives the first TSV unit to transmit the first signal; the second driving unit receives the input signal to output a second signal in an opposite direction of the input signal to the second TSV unit and drives the second TSV unit to transmit the second signal; and the receiving unit receives the first signal and the second signal to output a combined signal to the second die unit;
wherein the receiving unit includes an OR gate or a NOR gate to reconstruct the first signal and the second signal into the combined signal.

2. The double through silicon via structure of claim 1, wherein the first signal path further comprises a first switch unit, and the second signal path further comprises a second switch unit, and an input end of the first switch unit is electrically coupled to an output end of the inverter, and an output end of the first switch unit is electrically coupled to the third end of the first driving unit, and an input end of the second switch unit is electrically coupled to an output end of the inverter, and an output end of the second switch unit is electrically coupled to the third end of the second driving unit; wherein the first switch unit and the second switch unit receive the control signal to close a VDD driving path of the first driving unit and a VDD driving path of the second driving unit respectively.

3. The double through silicon via structure of claim 2, wherein the inverter generates the control signal upon a delay time, and the delay time is longer than a voltage rising time of the first signal transmitted by the first TSV unit, and a voltage rising time of the second signal transmitted by the second TSV unit.

4. The double through silicon via structure of claim 2, wherein the first signal path further comprises a first exchange unit, and the second signal path further comprises a second exchange unit, and an output end of the first exchange unit is electrically coupled to the input end of the receiving unit, and an input end of the first exchange unit is electrically coupled to an output end of the second TSV unit, and an output end of the second exchange unit is electrically coupled to the input end of the receiving unit, and an input end of the second exchange unit is electrically coupled to the output end of the first TSV unit;

wherein the first exchange unit receives the second signal, and when the second signal is zero, the second signal is transmitted to the receiving unit through the first exchange unit, and the second exchange unit receives the first signal, and when the first signal is zero, the second exchange unit is transmitted to the receiving unit through the first signal.

5. The double through silicon via structure of claim 4, wherein the first signal path further comprises a first VDD keeper, and the second signal path further comprises a second VDD keeper, and an input end of the first VDD keeper is electrically coupled to the first end of the first driving unit, and an output end of the first VDD keeper is electrically coupled to the second end of the first driving unit, and an input end of the second VDD keeper is electrically coupled to the first end of the second driving unit, and an output end of the second VDD keeper is electrically coupled to the second end of the second driving unit;

wherein the first VDD keeper has a driving capacity greater than the driving capacity of the first exchange unit in order to stabilize the first TSV unit to transmit the first signal to the receiving unit, and the second VDD keeper has a driving capacity greater than the driving capacity of the second exchange unit in order to stabilize the second TSV unit to transmit the second signal to the receiving unit.

6. The double through silicon via structure of claim 2, further comprising an exchange unit with an input end electrically coupled to output ends of the first TSV unit and the second TSV unit, and the output end of the exchange unit being electrically coupled to the input end of the receiving unit, wherein the exchange unit receives the first signal and the second signal, and when the first signal is zero, the first signal is transmitted to the second signal path and then to the receiving unit through the second signal path, and when the second signal is zero, the second signal is transmitted to the first signal path and then to the receiving unit through the first signal path.

7. The double through silicon via structure of claim 6, wherein the first signal path further comprises a first VDD keeper, and the second signal path further comprises a second VDD keeper, and an input end of the first VDD keeper is electrically coupled to the first end of the first driving unit, and an output end of the first VDD keeper is electrically coupled to the second end of the first driving unit, and an input end of the second VDD keeper is electrically coupled to the first end of the second driving unit, and an output end of the second VDD keeper is electrically coupled to the second end of the second driving unit;

wherein, the first VDD keeper and the second VDD keeper have a driving capacity greater than the driving capacity of the exchange unit in order to stabilize the first TSV unit to transmit the first signal to the receiving unit and stabilize the second TSV unit to transmit the second signal to the receiving unit.

\* \* \* \* \*